United States Patent
Shiihara

(10) Patent No.: US 10,826,518 B2
(45) Date of Patent: Nov. 3, 2020

(54) INPUT UNIT HAVING ANALOG-TO-DIGITAL CONVERSION UNIT AND TIMING CONTROL UNIT

(71) Applicant: OMRON Corporation, Kyoto (JP)

(72) Inventor: Koshiro Shiihara, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/161,085

(22) Filed: Oct. 16, 2018

(65) Prior Publication Data

US 2019/0238147 A1 Aug. 1, 2019

(30) Foreign Application Priority Data

Feb. 1, 2018 (JP) ................. 2018-016741

(51) Int. Cl.
| | |
|---|---|
| G06F 13/10 | (2006.01) |
| H03M 1/12 | (2006.01) |
| G01R 19/25 | (2006.01) |
| G05B 19/05 | (2006.01) |

(52) U.S. Cl.
CPC ........ *H03M 1/126* (2013.01); *G01R 19/2509* (2013.01); *G05B 19/054* (2013.01); *G06F 13/102* (2013.01); *H03M 1/123* (2013.01)

(58) Field of Classification Search
None
See application file for complete search history.

(56) References Cited

U.S. PATENT DOCUMENTS

| | | | |
|---|---|---|---|
| 8,412,032 B2 | 4/2013 | Harada et al. | |
| 9,634,567 B2 | 4/2017 | Oliaei | |
| 2004/0152418 A1* | 8/2004 | Sinha | H04L 27/0002 455/42 |
| 2014/0022092 A1 | 1/2014 | Stouffer et al. | |
| 2017/0055845 A1* | 3/2017 | Mirov | A61B 5/0205 |

FOREIGN PATENT DOCUMENTS

| | | |
|---|---|---|
| CN | 102497210 | 6/2012 |
| CN | 103713674 | 4/2014 |
| CN | 107543590 | 1/2018 |
| CN | 206922880 | 1/2018 |

(Continued)

OTHER PUBLICATIONS

"Search Report of Europe Counterpart Application", dated May 20, 2019, p. 1-p. 6.

(Continued)

*Primary Examiner* — Scott C Sun
(74) *Attorney, Agent, or Firm* — JCIPRNET

(57) ABSTRACT

A technology capable of sampling sensor signals in a plurality of channels simultaneously is realized. An input unit is capable of inputting sensor signals from a plurality of sensors, and includes an analog-to-digital (AD) conversion unit which is disposed with respect to each of the plurality of sensors and acquires the sensor signal from each of the sensors and converts the sensor signal into a digital signal, and a timing control unit which controls timing at which a plurality of the AD conversion units acquire the sensor signal for each of the AD conversion units according to a sampling period of each of the plurality of sensors.

4 Claims, 3 Drawing Sheets

(56) References Cited

FOREIGN PATENT DOCUMENTS

| JP | 2006054684 | 2/2006 |
|---|---|---|
| JP | 2010152867 | 7/2010 |

OTHER PUBLICATIONS

Texas Instruments Incorporated., "ADS8588S 16-Bit High-Speed 8-Channel Simultaneous-Sampling ADC With Bipolar Inputs on a Single Supply," Apr. 2017, pp. 1-61.

Tao Feng, et al., "The Implementation of Distributed High-speed High-accuracy Data Acquisition System Based on EtherCAT," 2013 IEEE 8th Conference on Industrial Electronics and Applications (ICIEA), Jun. 2013, pp. 1649-1653.

"Office Action of China Counterpart Application", dated Jun. 18, 2020, with English translation thereof, p. 1-p. 14.

\* cited by examiner

| Address | | |
|---|---|---|
| dec | hex | |
| 0960 | 000 | Timestamp 0 |
| 0962 | 002 | Timestamp 1 |
| 0964 | 004 | Timestamp 2 |
| 0966 | 006 | Timestamp 3 |
| 0968 | 008 | CH1 status |
| 0970 | 00A | Reserved |
| 0972 | 00C | Reserved |
| 0974 | 00E | Reserved |
| 0976 | 010 | Reserved |
| 0978 | 012 | CH1 sampling number (256) |
| | | . |
| | | (CH1 sampling data) |
| | | . |
| | | . |
| 1492 | 214 | CH2 status |
| 1494 | 216 | Reserved |
| 1496 | 218 | Reserved |
| 1498 | 21A | Reserved |
| 1500 | 21C | Reserved |
| 1502 | 21E | CH2 sampling number (80) |
| | | . |
| | | (CH2 sampling data) |
| | | . |
| | | . |
| 1664 | 2C0 | CH3 status |
| 1666 | 2C2 | Reserved |
| 1668 | 2C4 | Reserved |
| 1670 | 2C6 | Reserved |
| 1672 | 2C8 | Reserved |
| 1674 | 2CA | CH3 sampling number (512) |
| | | . |
| | | (CH3 sampling data) |
| | | . |
| | | . |
| 2700 | 6CC | CH4 status |
| 2702 | 6CE | Reserved |
| 2704 | 6D0 | Reserved |
| 2706 | 6D2 | Reserved |
| 2708 | 6D4 | Reserved |
| 2710 | 6D6 | CH4 sampling number (336) |
| | | . |
| | | (CH4 sampling data) |
| | | . |

FIG. 4

INPUT UNIT HAVING ANALOG-TO-DIGITAL CONVERSION UNIT AND TIMING CONTROL UNIT

CROSS-REFERENCE TO RELATED APPLICATION

This application claims the priority benefit of Japan Application No. 2018-016741, filed on Feb. 1, 2018. The entirety of the above-mentioned patent application is hereby incorporated by reference herein and made a part of this specification.

BACKGROUND

Technical Field

The disclosure relates to an input unit into which sensor signals from a plurality of sensors are input.

Description of Related Art

Conventionally, there is a known receiving apparatus (see Patent Document 1, for example) that acquires input signals from a plurality of sensors, generates transmission data from the acquired input signals and transfers the transmission data to an industrial control device such as a programmable logic controller (hereinafter abbreviated as "PLC"). In these receiving apparatuses, multichannel sampling that samples sensor signals from a plurality of sensors is realized by the internal processing of an analog-to-digital (A/D) converter.

[Patent Document 1] Japanese Laid-open No. 2010-152867 (publication date: Jul. 8, 2010)

[Patent Document 2] Japanese Laid-open No. 2006-054684 (publication date: Feb. 23, 2006)

However, in cases where multichannel sampling is realized by the internal processing of an A/D converter, it is necessary to shift the timing at which the A/D converter acquires an input signal from each sensor, and it was impossible to sample sensor signals in a plurality of channels simultaneously.

SUMMARY

An input unit according to the disclosure is an input unit capable of inputting sensor signals from a plurality of sensors. The input unit includes an analog-to-digital (AD) conversion unit that is disposed with respect to each of the plurality of sensors, acquires the sensor signal from each of the sensors and converts the sensor signal into a digital signal, and a timing control unit that controls timing at which a plurality of the AD conversion units acquire the sensor signals for each of the AD conversion units according to a sampling period of each of the plurality of sensors.

BRIEF DESCRIPTION OF THE DRAWINGS

FIG. 4 illustrates an example of transmission data generated by a data generation unit.

DESCRIPTION OF THE EMBODIMENTS

Figure 1:
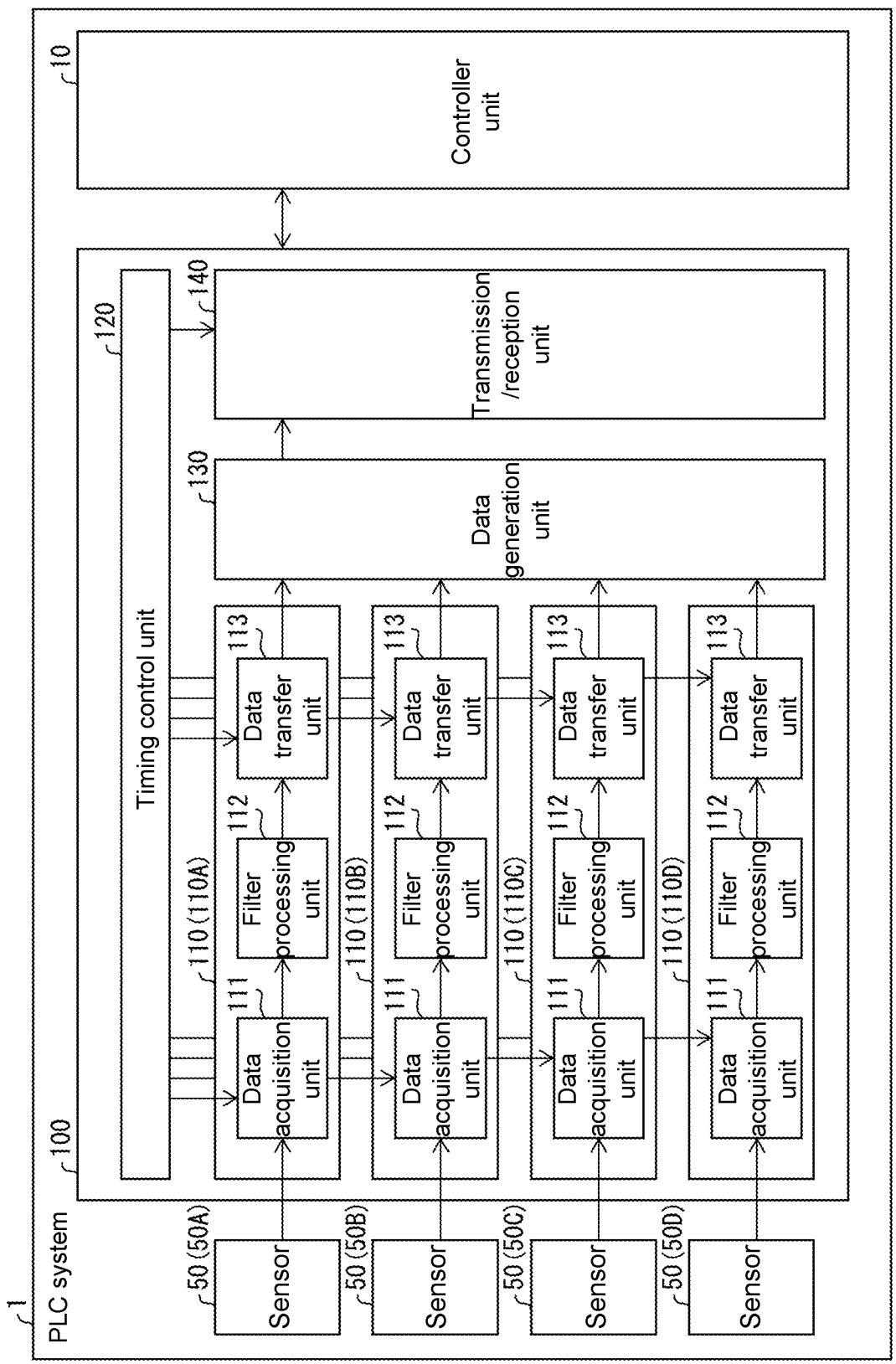
FIG. 1 is a circuit block diagram illustrating a schematic configuration of an input unit according to the present embodiment.

An embodiment of the disclosure realizes a technology capable of sampling sensor signals in a plurality of channels simultaneously.

An input unit according to the disclosure is an input unit capable of inputting sensor signals from a plurality of sensors. The input unit includes an analog-to-digital (AD) conversion unit that is disposed with respect to each of the plurality of sensors, acquires the sensor signal from each of the sensors and converts the sensor signal into a digital signal, and a timing control unit that controls timing at which a plurality of the AD conversion units acquire the sensor signals for each of the AD conversion units according to a sampling period of each of the plurality of sensors.

According to the above configuration, the AD conversion unit is disposed with respect to each of the plurality of sensors. In addition, by the timing control unit, the timing at which the AD conversion unit acquires the sensor signals is controlled for each AD conversion unit according to the sampling period of each of the sensors. Therefore, it is possible to sample the sensor signals from the plurality of sensors simultaneously. In this way, it is possible to sample sensor signals from a plurality of sensors in a short sampling period and to respond to a user's needs such as to see subtle changes in a sensor signal and to see a plurality of sensor signals at the same time.

Further, in the input unit according to the disclosure, the timing control unit may variably control the sampling period of each of the plurality of sensors for each of the sensors.

According to the above configuration, since the sampling period of each of the sensors can be changed for each sensor, the sampling period of the sensor signal from each sensor can be changed according to the user's needs. Therefore, for example, in cases where the user wishes to see a subtle change in the sensor signal from one sensor, it is also possible to change only the sampling period of the sensor signal from the sensor.

Also, the input unit according to the disclosure may include a filter processing unit that performs filter processing on the sensor signal converted into the digital signal by the AD conversion unit, and a data generation unit that generates transmission data from the sensor signal from each sensor on which the filter processing has been performed by the filter processing unit.

According to the above configuration, it is possible to perform filter processing with high accuracy on the sensor signal acquired in a short sampling period. In addition, since the transmission data is generated from the sensor signal from each sensor on which the filter processing has been performed, highly-accurate data can be provided to a host device.

According to an embodiment of the disclosure, it is possible to sample the sensor signals in a plurality of channels simultaneously.

Hereinafter, an embodiment (hereinafter also referred to as "the present embodiment") according to an aspect of the disclosure will be described with reference to the drawings. However, the present embodiment described below is merely an example of the disclosure in all respects. It goes without saying that various improvements and modifications can be made without departing from the scope of the disclosure. In other words, a specific configuration according to the embodiment may be appropriately adopted when implementing the disclosure. Although the data appearing in the present embodiment is described in natural language, more specifically, it is specified by a computer-recognizable pseudo-language, command, parameter, machine language, etc.

§ 1 Application Example

First, with reference to FIG. 1, an example of a scenario in which the disclosure is applied will be described. FIG. 1 illustrates an example of a schematic configuration of a data sampling device (input unit) 100 according to the present embodiment. As shown in FIG. 1, for example, the data sampling device 100 according to the present embodiment is used as a functional unit of a programmable logic controller (PLC) system 1 having a PLC used as a controller unit 10. The PLC system 1 is a system in which the controller unit 10 controls an output device that is a controlled object such as a machine, equipment, etc. with a sensor signal from an input device having a sensor 50. Examples of the input device include a "detector" such as a temperature sensor, an optical sensor, etc. or a "switch" (a pushbutton switch, a limit switch, a pressure switch, etc.), and the like. Examples of the output device include a "motor", a "robot arm", an "actuator", a "relay", a "solenoid valve", an "indicator", an "indication lamp", etc.

The PLC system 1 includes the data sampling device 100 configured to perform sampling processing on the signal from the sensor 50 being the input device and the controller unit 10 configured to perform arithmetic processing using data on which the sampling processing has been performed by the data sampling device 100 and generate output data for controlling the controlled object.

The data sampling device 100 is, for example, an input unit in an FA (Factory Automation) device and is an input unit capable of inputting the sensor signals from the plurality of sensors 50. The data sampling device 100 performs filter processing on the sensor signal acquired from each of the plurality of sensors 50 at high speed using a field-programmable gate array (FPGA) and the like, and transfers the sensor signal to the controller unit 10. As a result, the data sampling device 100 reduces the amount of communication with the controller unit 10 and calculation load of the controller unit 10.

The data sampling device 100 is not limited to the configuration used as the functional unit of the PLC system 1, but may be a device that acquires the sensor signal from the sensor 50 being the input device, performs filter processing and transfers data to an external device for controlling the controlled object such as an industrial PC (IPC), etc.

As shown in FIG. 1, the data sampling device 100 has data processing channels 110 that is disposed with respect to each of the plurality of sensors 50 and is configured to process the sensor signal acquired from the sensor 50. Each of the data processing channels 110 has a data acquisition unit (AD conversion unit) 111 configured to acquire the sensor signal from the sensor 50. The data acquisition unit 111 has an analog-to-digital (AD) conversion circuit configured to convert a sensor signal which is an analog signal into a digital signal.

Further, the data sampling device 100 has a timing control unit 120 configured to control timing at which each of the plurality of data acquisition units 111 acquires the sensor signal from the sensor 50 for each data acquisition unit 111 according to the sampling period of each of the plurality of sensors 50.

In addition, the timing control unit 120 controls timing of transferring the sensor signal that is processed in each data processing channel 110. The timing control unit 120 may be implemented by using an FPGA.

Further, the data sampling device 100 includes a data generation unit 130 configured to generate transmission data by acquiring the sensor signal transferred from each of the plurality of data processing channels 110. Moreover, the data sampling device 100 includes a transmission/reception unit (transmission unit) 140 configured to transmit the transmission data generated by the data generation unit 130 to the controller unit 10 under the control of the timing control unit 120. The transmission/reception unit 140 functions as a transmission unit configured to transmit data to the controller unit 10 and also functions as a reception unit configured to receive data, such as control information, etc., from the controller unit 10.

Thus, in the present embodiment, the sensor signal can be acquired from the sensor 50 connected to each of the plurality of data processing channels 110 according to the sampling period of each sensor 50. Therefore, the sampling period for acquiring the sensor signal from each of the plurality of sensors 50 can be made independent for each sensor 50, and the sensor signals can be acquired through the plurality of data processing channels 110 at the same time.

§ 2 Configuration Example

Hereinafter, the configuration of the data sampling device 100 according to the embodiment of the disclosure will be described in detail based on FIG. 1 to FIG. 4.

Figure 2:
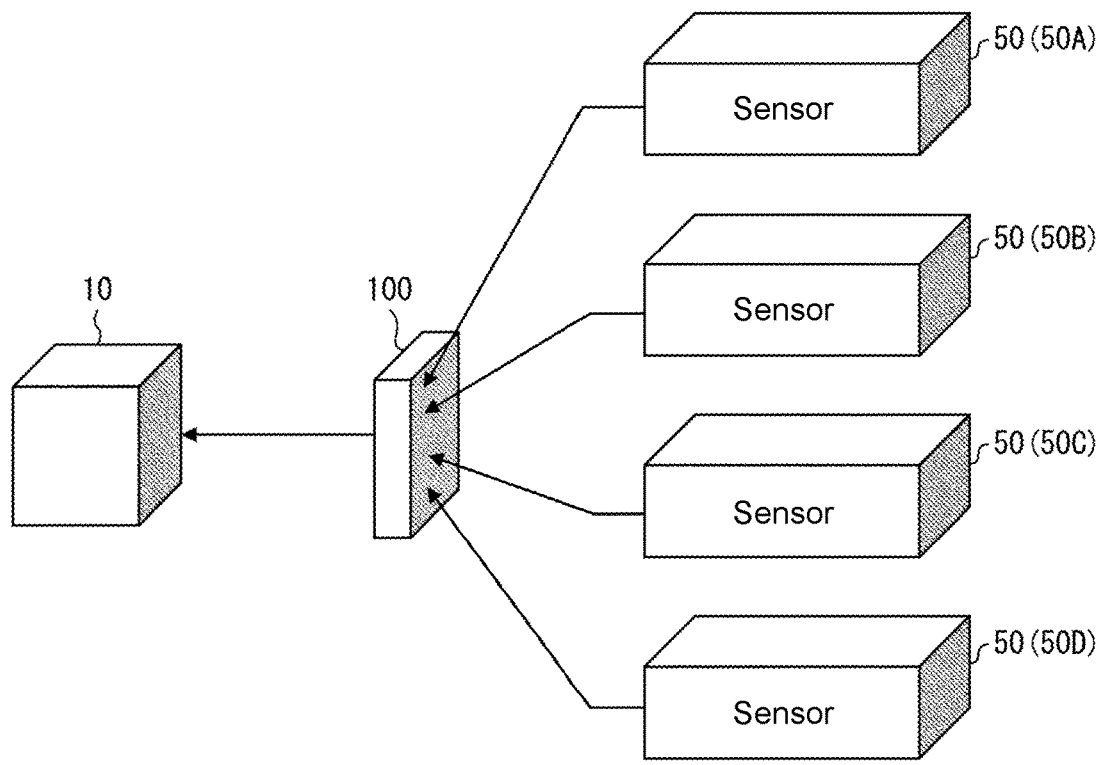
FIG. 2 schematically illustrates a configuration of the input unit according to the present embodiment.

FIG. 1 is a circuit block diagram illustrating a schematic configuration of the PLC system 1 including the data sampling device 100. FIG. 2 schematically illustrates the configuration of the PLC system 1 including the data sampling device 100. As shown in FIGS. 1 and 2, the PLC system 1 has a plurality of sensors 50 (50A, 50B, 50C and 50D), the data sampling device 100, and the controller unit 10. The controller unit 10 may be a configuration realized by using a programmable logic controller (PLC). Although not illustrated, the data sampling device 100 may be a configuration connected to an external device such as an external controller, etc. via a communication network.

The controller unit 10 performs the main arithmetic processing in the PLC system 1. The controller unit 10 controls a controlled object by repeating processes such as transmission of output data, reception of input data, implementation of a control program for generating the output data using the input data, and the like.

The sensor 50 detects a state value (e.g., a physical quantity such as weight, pressure, etc.) of the controlled object not shown in the drawings and outputs a sensor signal corresponding to the detected state value. The sensor 50 is, for example, a load cell attached to the controlled object (for example, an industrial machine such as a metering device, etc.). The controlled object is, for example, a platform scale system, a quantitative cutting control system, a press-fitting system, etc.

(Configuration of the Data Sampling Device 100)

The data sampling device 100 has the data processing channel 110, the timing control unit 120, the data generation unit 130, and the transmission/reception unit 140. The data sampling device 100 functions as an input unit capable of inputting the sensor signals from the plurality of sensors 50. The data sampling device 100 is a signal processing device configured to acquire the sensor signal from each of the plurality of sensors 50, perform AD conversion processing and filter processing on the acquired sensor signal, and transmit the sensor signal to the controller unit 10.

As shown in FIG. 1, the data sampling device 100 is formed by an input unit accommodating a plurality of AD conversion circuits constituting the plurality of data processing channels 110 in one housing and connected to the plurality of sensors 50. According to this configuration, processing of the sensor signals from the plurality of sensors 50 can be completed within the data sampling device 100 that serves as one input unit, and it is possible to simplify the PLC system 1 and to reduce wiring of the PLC system 1.

As shown in FIG. 1, the data processing channel 110 is a functional block disposed with respect to each of the plurality of sensors 50 and configured to process the sensor signal from each of the sensors 50, and includes the data acquisition unit 111, a filter processing unit 112, and a data transfer unit 113.

The data acquisition unit 111 is disposed in each of the plurality of data processing channels 110 and acquires the sensor signal from the sensor 50 in a predetermined data acquisition period corresponding to the sampling period of the corresponding sensor 50. The data acquisition unit 111 is an analog-to-digital (A/D) converter configured to convert the sensor signal which is an analog signal into a digital signal. Further, the data acquisition unit 111 may have a function of amplifying the sensor signal acquired from the sensor 50.

The filter processing unit 112 performs filter processing on the sensor signal acquired by the data acquisition unit 111. The filter processing unit 112, for example, has a digital filter and removes frequency noise from the sensor signal. There is no particular limitation on the type and number of filters provided in the filter processing unit 112. The types of filters provided in the filter processing unit 112 may include, for example, a low pass filter, a moving average filter, a notch filter, etc.

The data transfer unit 113 transfers some of the sensor signals acquired through the data acquisition unit 111 and subjected to filter processing by the filter processing unit 112 to the data generation unit 130 in chronological order. A data transfer period during which the data transfer unit 113 transfers the sensor signal to the data generation unit 130 lasts longer than a data acquisition period during which the data acquisition unit 111 acquires the sensor signal from the sensor 50. Among the sensor signals acquired through the data acquisition unit 111 in the predetermined data acquisition period and subjected to filter processing by the filter processing unit 112, the data transfer unit 113 transfers only some of the sensor signals that have synchronized data acquisition period and data transfer period to the data generation unit 130.

In this way, the data processing channel 110 thins out the sensor signals that have been subjected to filter processing by the filter processing unit 112 and transfers some of the sensor signals to the data generation unit 130 in chronological order. As a result, it is possible to remove, with high accuracy, noise from the sensor signal acquired in the data acquisition period shorter than the data transfer period.

As described above, in a configuration in which the filter processing unit 112 has a digital filter and removes the frequency noise of the sensor signal, the frequency of the noise that can be removed depends on a data acquisition frequency of the data acquisition unit 111. That is, the higher the data acquisition frequency, the wider the range of the frequency of the noise that can be removed by the digital filter. In the present embodiment, the data acquisition frequency of the data acquisition unit 111 is raised, and the acquired sensor signal is thinned out after being subjected to filter processing and is transferred to the data generation unit 130. As a result, the data sampling device 100 can remove high frequency noise with high accuracy and transfer data to the controller unit 10 at high speed.

In this way, since the noise of a wide range of frequencies can be removed by the filter processing unit 112, the accuracy of filter processing can improve. Further, the data processing channel 110 thins out the sensor signal that has been subjected to filter processing and transfers some of the acquired sensor signals to the data generation unit 130, so it is possible to reduce the data communication amount. Therefore, the data sampling device 100 can transfer high-speed and highly-accurate filtering processing data to the controller unit 10.

The data sampling device 100 includes the plurality of data processing channels 110 having the data acquisition unit 111, the filter processing unit 112, and the data transfer unit 113. FIGS. 1 and 2 illustrate the data sampling device 100 having four data processing channels 110A, 110B, 110C and 110D, each of the data processing channels 110A to 110D having the data acquisition unit 111, the filter processing unit 112 and the data transfer unit 113, respectively. Each of the data processing channels 110A to 110D processes the sensor signal acquired from the corresponding sensors 50A to 50D. The number of the data processing channels 110 included in the data sampling device 100 is not limited to four.

The data generation unit 130 acquires the sensor signal transferred from the data transfer unit 113 in a predetermined data transfer period and generates the transmission data. In this way, from among the sensor signals subjected to filter processing by the filter processing unit 112, the data generation unit 130 acquires the sensor signal transferred from the filter processing unit 112 via the data transfer unit 113 in the predetermined data transfer period different from the data acquisition period of the data acquisition unit 111, so as to extract some of the sensor signals. That is, the data generation unit 130 extracts some of the sensor signals subjected to filter processing by the filter processing unit 112 by acquiring the sensor signal thinned out by the data transfer unit 113.

The data generation unit 130 collects the sensor signals transferred in the predetermined data transfer period from the data transfer unit 113 over a plurality of transfer periods to generate the transmission data. In this way, by collecting the sensor signals of the plurality of transfer periods to generate the transmission data, the data communication amount can be reduced, and high-speed data sampling can be made possible.

In addition, the data generation unit 130 acquires the sensor signals subjected to filter processing by each of the plurality of data processing channels 110A to 110D with some of them being thinned out, so as to generate the transmission data corresponding to the sensor signal from each of the data processing channels 110A to 110D.

(Regarding Data Acquisition Timing of the Data Acquisition Unit 111)

Figure 3:
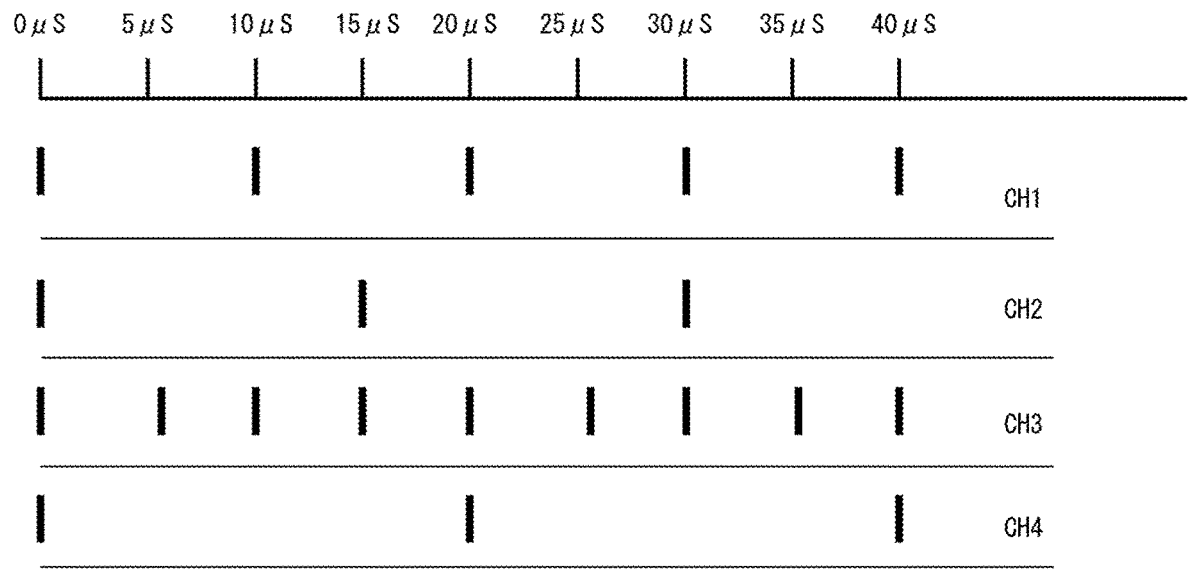
FIG. 3 illustrates an example of data acquisition timing of the input unit according to the present embodiment.

FIG. 3 illustrates an example of controlling the timing of acquiring the sensor signal from each of the plurality of sensors 50 by the timing control unit 120. FIG. 3 illustrates an example of acquiring the sensor signals from the four sensors 50 via four data processing channels CH1, CH2, CH3, and CH4. In addition, in FIG. 3, the sampling period of each of the data processing channels CH1 to CH4 is shown in solid black line.

The data acquisition unit 111 of each of the data processing channels CH1 to CH4 acquires the sensor signal from the sensor 50 in respectively different data acquisition periods according to the sampling period of each of the corresponding sensors 50. For example, in the data processing channel CH1, the timing control unit 120 controls the data acquisition unit 111 so as to acquire the sensor signal from the sensor 50 in a data acquisition period of 10 µs. In the data processing channel CH2, the timing control unit 120 controls the data acquisition unit 111 so as to acquire the sensor signal from the sensor 50 in a data acquisition period of 15 µs. In the data processing channel CH3, the timing control unit 120 controls the data acquisition unit 111 so as to acquire the sensor signal from the sensor 50 in a data acquisition period of 5 µs. In the data processing channel CH4, the timing control unit 120 controls the data acquisition unit 111 so as to acquire the sensor signal from the sensor 50 in a data acquisition period of 20 µs.

In this manner, since the timing control unit 120 controls the data acquisition timing at which the plurality of data acquisition units 111 acquire the sensor signal from each of the sensors 50 respectively, as shown in the example of FIG. 3, the sensor signals from the sensors 50 are simultaneously acquired by the data acquisition units 111 in all of the data processing channels CH1 to CH4 at 0 µs. Further, at 10 µs, the sensor signals from the sensors 50 are simultaneously acquired by the data acquisition units 111 in the data processing channels CH1 and CH3. Moreover, at 20 µs and 40 µs, the sensor signals from the sensors 50 are simultaneously acquired by the data acquisition units 111 in the data processing channels CH1, CH3, and CH4. In addition, at 15 µs, the sensor signals from the sensors 50 are simultaneously acquired by the data acquisition units 111 in the data processing channels CH2 and CH3.

In this manner, the sensor signals from the sensors 50 are simultaneously acquired by the data acquisition units 111 in the plurality of data processing channels CH1 to CH4. Therefore, it is possible to sample the sensor signals from the plurality of sensors in a short sampling period of, for example, 5 µs, etc. Accordingly, it is possible to respond to the user's needs such as to see subtle changes in a sensor signal and to see simultaneous sensor signals from a plurality of sensors.

Further, the timing control unit 120 may be capable of variably controlling the sampling period of each of the plurality of sensors 50 for each sensor. For example, in accordance with the sampling period of each sensor set by the user via a user interface (not shown), the timing control unit 120 may control the timing at which each of the data acquisition units 111 acquires the sensor signal from the sensor 50.

FIG. 4 illustrates an address map of a memory of the data generation unit 130. As shown in FIG. 4, in the data generation unit 130, in accordance with a preset number of data, the data corresponding to the sensor signal from each of the data processing channels 110A to 110D is stored in chronological order. The data generation unit 130 updates the map in each data transmission/reception period. The data generation unit 130 calculates a starting address and updates the map in each data transmission/reception period. Further, for each of the data processing channels 110A to 110D, the data generation unit 130 sets a data sampling number and stores the data corresponding to the set data sampling number in each data transmission/reception period.

In FIG. 4, various data shown below is stored in addresses indicated in decimal notation (dec) and hexadecimal notation (hex). The data generation unit 130 stores a timestamp indicating a start time of a data transmission/reception period of the controller unit 10 at a predetermined address for each data transmission/reception period. In the example shown in FIG. 4, timestamps 0 to 3 indicate the start time of the data transmission/reception period.

Further, the data generation unit 130 may reserve an address for recording information indicating a status of each of the data processing channels 110A to 110D in each data transmission/reception period. In the status (CH status) of a channel, information showing whether the state of the channel is a normal state or an error state is written.

In addition, the data generation unit 130 may reserve an address that can be used for other purposes other than the value of sampling data with respect to each of the data processing channels 110A to 110D. In the example shown in FIG. 4, an address which can be used for other purposes is shown as "reserved".

Moreover, the data generation unit 130 assigns, to the predetermined address, a sampling number that is information showing the number of data sampled, from among the data of the data processing channels 110A to 110D, in each of the channels in one data transmission/reception period. In the example shown in FIG. 4, the sampling number is shown as "CH1 sampling number (256)," etc.

The data generation unit 130 stores the sampling data of the predetermined sampling number at each address (addresses between addresses 0978 and 1492 in the case of between CH1 and CH2) following the address indicating the sampling number of one data processing channel.

When one data transmission/reception period ends (at 70 µs in the example shown in FIG. 3), the data generation unit 130 clears the memory and appropriately stores the various data of the next data transmission/reception period at each address. Further, since the data acquisition period of the data acquisition unit 111 acquiring data is different in each data processing channel, the number of data sampled per data transmission/reception period may be different.

The transmission/reception unit 140 transmits the transmission data generated by the data generation unit 130 to the controller unit 10 in a predetermined data transmission period longer than the data acquisition period of the data acquisition unit 111. The transmission/reception unit 140 transmits the transmission data generated by the data generation unit 130 to the controller unit 10 in a data transmission period synchronized with a communication period of the controller unit 10.

Incidentally, the PLC system 1 performs a series of cycles such as common processing, program execution processing, I/O (Input/Output) refresh processing, peripheral service processing, etc. by a predetermined cycle time. The controller unit 10 performs communication with various functional units that are controlled objects at the timing (communication period) of each cycle of the PLC system 1.

The timing control unit 120 controls the data acquisition period of the data acquisition unit 111, the data transfer period of the data transfer unit 113, and the data transmission period of the transmission/reception unit 140. The timing control unit 120 has a time synchronizing function that is based on, for example, a distributed clock (DC) method. The data sampling device 100 and the controller unit 10 have timers which periodically generate time information (reference clock), serving as clocks respectively, constituting a standard for synchronization. The timing control unit 120 is configured to correct time lag occurring in these timers and synchronize the data transmission period of the transmission/reception unit 140 with the communication period of the controller unit 10.

Implementation Example by Software

A control block (particularly the data acquisition unit 111, the data processing unit 112, the data transfer unit 113, the timing control unit 120, the data generation unit 130, and the transmission/reception unit 140) of the data sampling device 100 may be achieved by a logic circuit (hardware) formed by an integrated circuit (IC chip), etc., or may be achieved by software.

In the latter case, the data sampling device 100 includes a computer that executes commands of a program which is software that realizes each function. This computer includes, for example, one or more processors, and a computer-readable recording medium storing the above program. In the above computer, the disclosure is achieved by the processor reading the above program from the above recording medium and executing the program. As the above processor, for example, a central processing unit (CPU) can be used. As the above recording medium, a "non-transitory tangible medium" such as a read only memory (ROM), a tape, a disk, a card, a semiconductor memory, a programmable logic circuit, etc. can be used. Further, a random access memory (RAM) and the like for developing the above program may further be included. Moreover, the above program may be supplied to the above computer via an arbitrary transmission medium (a communication network, a broadcast wave, etc.) capable of transmitting the program. In addition, in an embodiment of the disclosure, the above program can be achieved in a form of a data signal embedded in a carrier wave, embodied by electronic transmission.

The disclosure is not limited to the embodiments described above, various modifications are possible within the scope indicated in the claims, and embodiments obtained by appropriately combining technical means respectively disclosed in different embodiments are also included in the technical scope of the disclosure.

What is claimed is:

1. An input unit capable of inputting sensor signals from a plurality of sensors, comprising:
   a plurality of analog-to-digital conversion units that are disposed with respect to each of the plurality of sensors, acquire the sensor signals from the sensors and convert the sensor signal into a digital signal; and
   a timing control unit that controls timing at which the plurality of the analog-to-digital conversion units acquire the sensor signals for each of the analog-to-digital conversion units according to a sampling period of each of the plurality of sensors,
   wherein the plurality of analog-to-digital conversion units includes a first analog-to-digital conversion unit and a second analog-to-digital conversion unit, and the timing control unit controls the first analog-to-digital conversion unit to acquire first sensor signals from a first sensor among the sensors at first timings and controls the second analog-to-digital conversion unit to acquire second sensor signals from a second sensor among the sensors at second timings, wherein one of the first timings is same as one of the second timings.

2. The input unit according to claim 1, comprising:
   a filter processing unit that performs filter processing on the sensor signal converted into the digital signal by the analog-to-digital conversion unit; and
   a data generation unit that generates transmission data from the sensor signal from each sensor on which the filter processing has been performed by the filter processing unit.

3. The input unit according to claim 1, comprising:
   a filter processing unit that performs filter processing on the sensor signal converted into the digital signal by the analog-to-digital conversion unit; and
   a data generation unit that generates transmission data from the sensor signal from each sensor on which the filter processing has been performed by the filter processing unit.

4. An input unit, receiving sensor signals from a plurality of sensors, comprising:
   a plurality of analog-to-digital conversion units, each coupled to at least one of the plurality of sensors, acquiring the sensor signal from the corresponding sensor, and converting the sensor signal into a digital signal; and
   a timing control unit that controls one of analog-to-digital conversion units to acquire first sensor signals at first timings and other one of analog-to-digital conversion units to acquire second sensor signals at second timings, wherein one of the first timings is same as one of the second timings.

* * * * *